US012670306B2

(12) United States Patent
Xu

(10) Patent No.: US 12,670,306 B2
(45) Date of Patent: Jun. 30, 2026

(54) DETECTION METHOD, SYSTEM, ELECTRONIC EQUIPMENT, AND STORAGE MEDIUM OF PRODUCT TEST DATA

(71) Applicant: ADVANTEST CORPORATION, Tokyo (JP)

(72) Inventor: Kun Xu, Tokyo (JP)

(73) Assignee: ADVANTEST CORPORATION, Tokyo (JP)

( * ) Notice: Subject to any disclaimer, the term of this patent is extended or adjusted under 35 U.S.C. 154(b) by 717 days.

(21) Appl. No.: 18/119,844

(22) Filed: Mar. 10, 2023

(65) Prior Publication Data

US 2023/0214568 A1 Jul. 6, 2023

Related U.S. Application Data

(63) Continuation of application No. PCT/CN2021/104882, filed on Jul. 7, 2021.

(30) Foreign Application Priority Data

Sep. 23, 2020 (CN) .......................... 202011007511.8

(51) Int. Cl.
*G06F 30/333* (2020.01)
(52) U.S. Cl.
CPC .................................. *G06F 30/333* (2020.01)
(58) Field of Classification Search
USPC ........................................................ 716/136
See application file for complete search history.

(56) References Cited

U.S. PATENT DOCUMENTS

| | | | |
|---|---|---|---|
| 2013/0091396 A1 | 4/2013 | Portolan | |
| 2018/0364302 A1 | 12/2018 | Chieu | |

(Continued)

FOREIGN PATENT DOCUMENTS

| | | |
|---|---|---|
| CN | 102117730 A | 7/2011 |
| CN | 110138637 A | 8/2019 |

(Continued)

OTHER PUBLICATIONS

Christian Streitwieser, "Development of Adaptive Test Methods for Semiconductors including Devices for Healthcare Applications", Master Thesis, Graz University of Technology, Sep. 2012.

*Primary Examiner* — Bryce M Aisaka

(57) ABSTRACT

The present invention discloses a detection method, a system, an electronic equipment, and a storage medium of product test data, where the detection method includes: obtaining historical test data of historical batches of products; screening the historical test data to obtain intermediate test data; grouping the intermediate test data based on preset test parameters to obtain first groups; obtaining distribution patterns of the first groups based on the intermediate test data of the first groups; when the distribution pattern is a preset distribution pattern, using the first group corresponding to the distribution pattern as a target group; and obtaining a target test limit value based on the intermediate test data corresponding to the target group. In the present invention, the test limit value can be adjusted dynamically and adaptively, and chip test data with abnormal data can be effectively detected in real time, which improves test quality of the chip.

13 Claims, 11 Drawing Sheets

(56)       References Cited

U.S. PATENT DOCUMENTS

2019/0160494 A1       5/2019  Linde et al.
2020/0089820 A1*      3/2020  Luo ..................... G06F 30/3323

FOREIGN PATENT DOCUMENTS

CN        110596566 A      12/2019
CN        111177222 A       5/2020
CN        111220889 A       6/2020

* cited by examiner

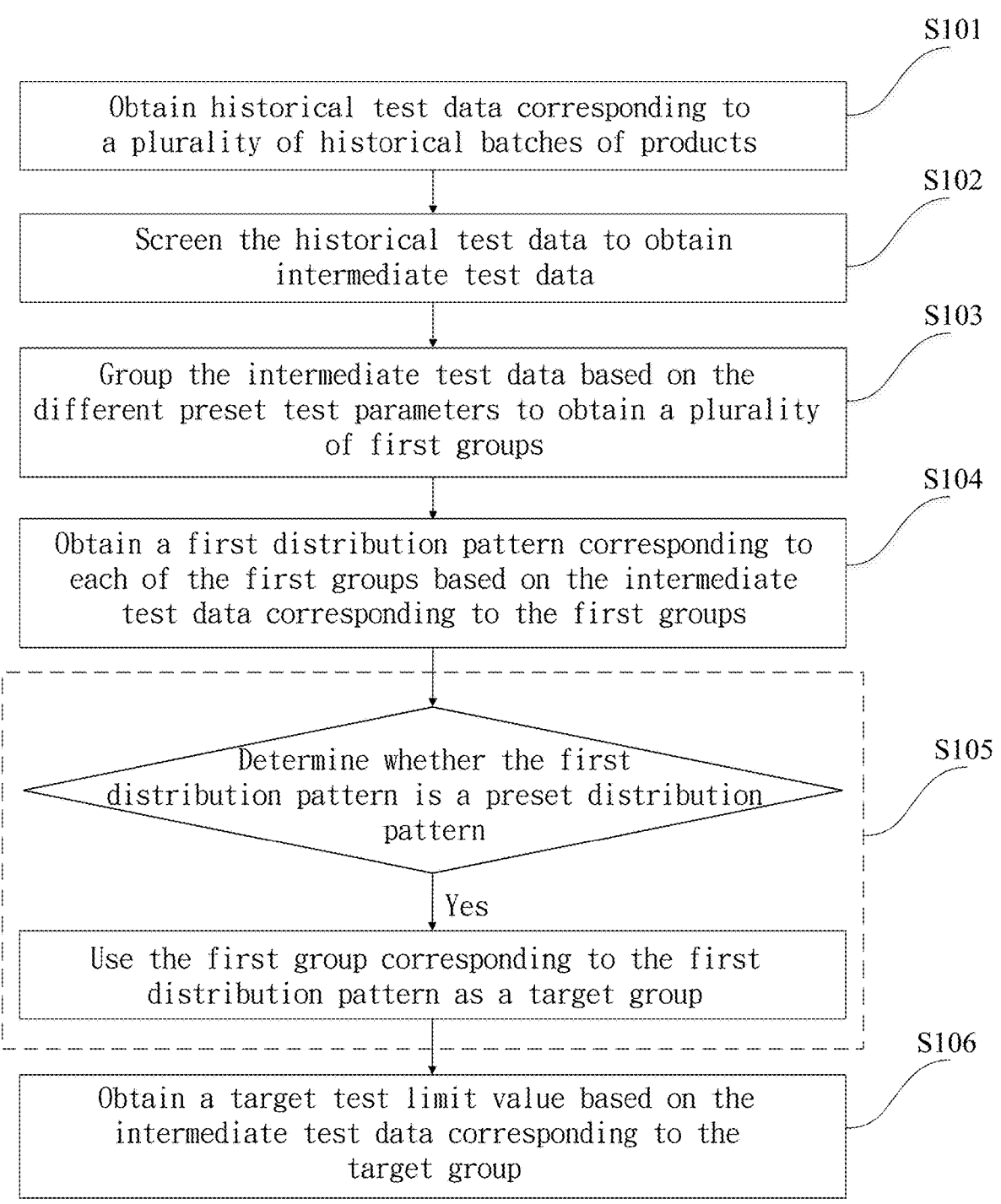

Obtain historical test data corresponding to
a plurality of historical batches of products
S101

Screen the historical test data to obtain
intermediate test data
S102

Group the intermediate test data based on the
different preset test parameters to obtain a plurality
of first groups
S103

Obtain a first distribution pattern corresponding to
each of the first groups based on the intermediate
test data corresponding to the first groups
S104

Determine whether the first
distribution pattern is a preset distribution
pattern
S105

Yes

Use the first group corresponding to the first
distribution pattern as a target group Obtain a target test limit value based on the
intermediate test data corresponding to the
target group
S106

FIG. 1

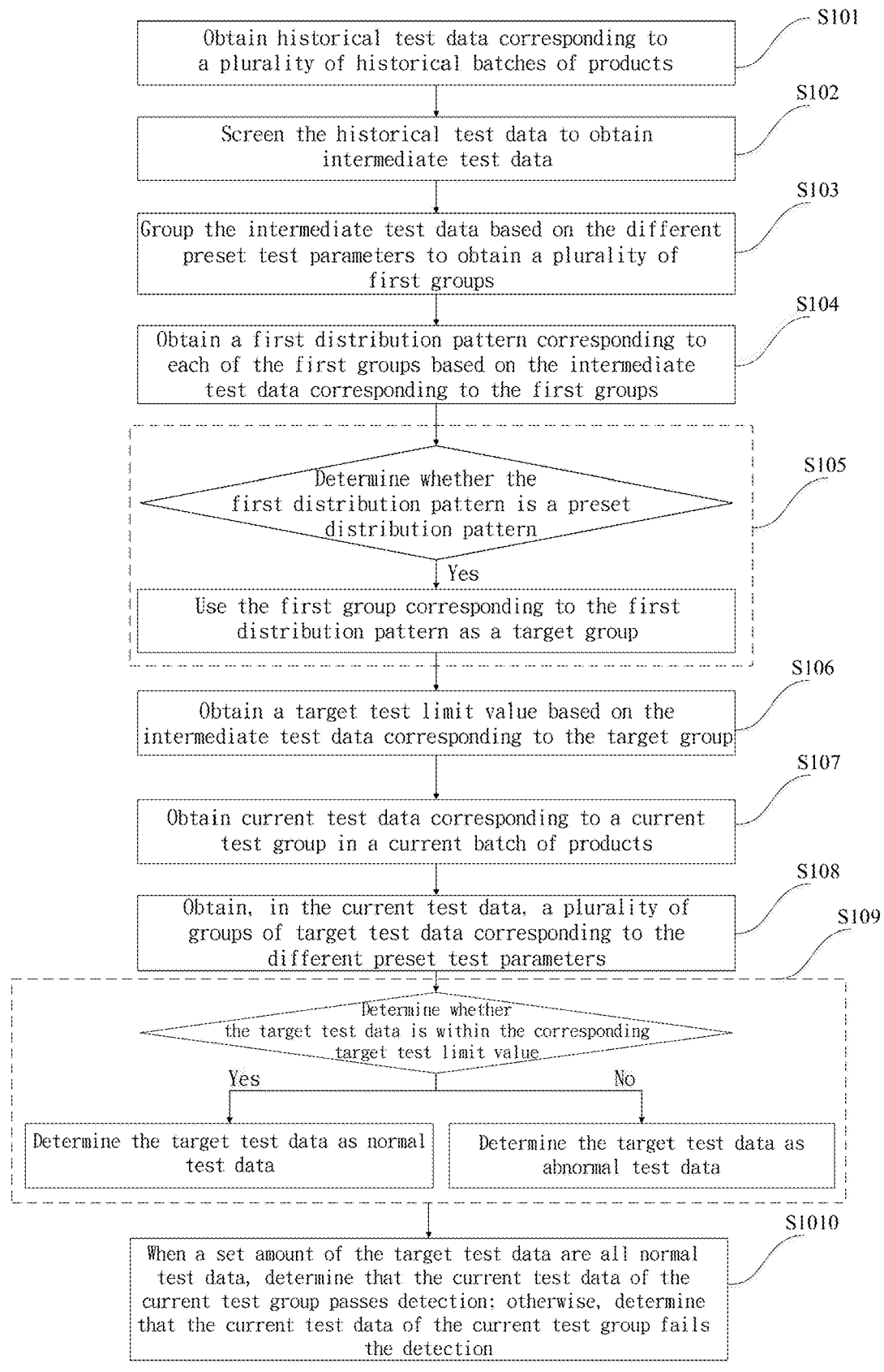

Obtain historical test data corresponding to a plurality of historical batches of products ⟋ S101

Screen the historical test data to obtain intermediate test data ⟋ S102

Group the intermediate test data based on the different preset test parameters to obtain a plurality of first groups ⟋ S103

Obtain a first distribution pattern corresponding to each of the first groups based on the intermediate test data corresponding to the first groups ⟋ S104

Determine whether the first distribution pattern is a preset distribution pattern ⟋ S105

Yes

Use the first group corresponding to the first distribution pattern as a target group Obtain a target test limit value based on the intermediate test data corresponding to the target group ⟋ S106

Obtain current test data corresponding to a current test group in a current batch of products ⟋ S107

Obtain, in the current test data, a plurality of groups of target test data corresponding to the different preset test parameters ⟋ S108 S109

Determine whether the target test data is within the corresponding target test limit value Yes                              No Determine the target test data as normal test data          Determine the target test data as abnormal test data When a set amount of the target test data are all normal test data, determine that the current test data of the current test group passes detection; otherwise, determine that the current test data of the current test group fails the detection ⟋ S1010

FIG. 3

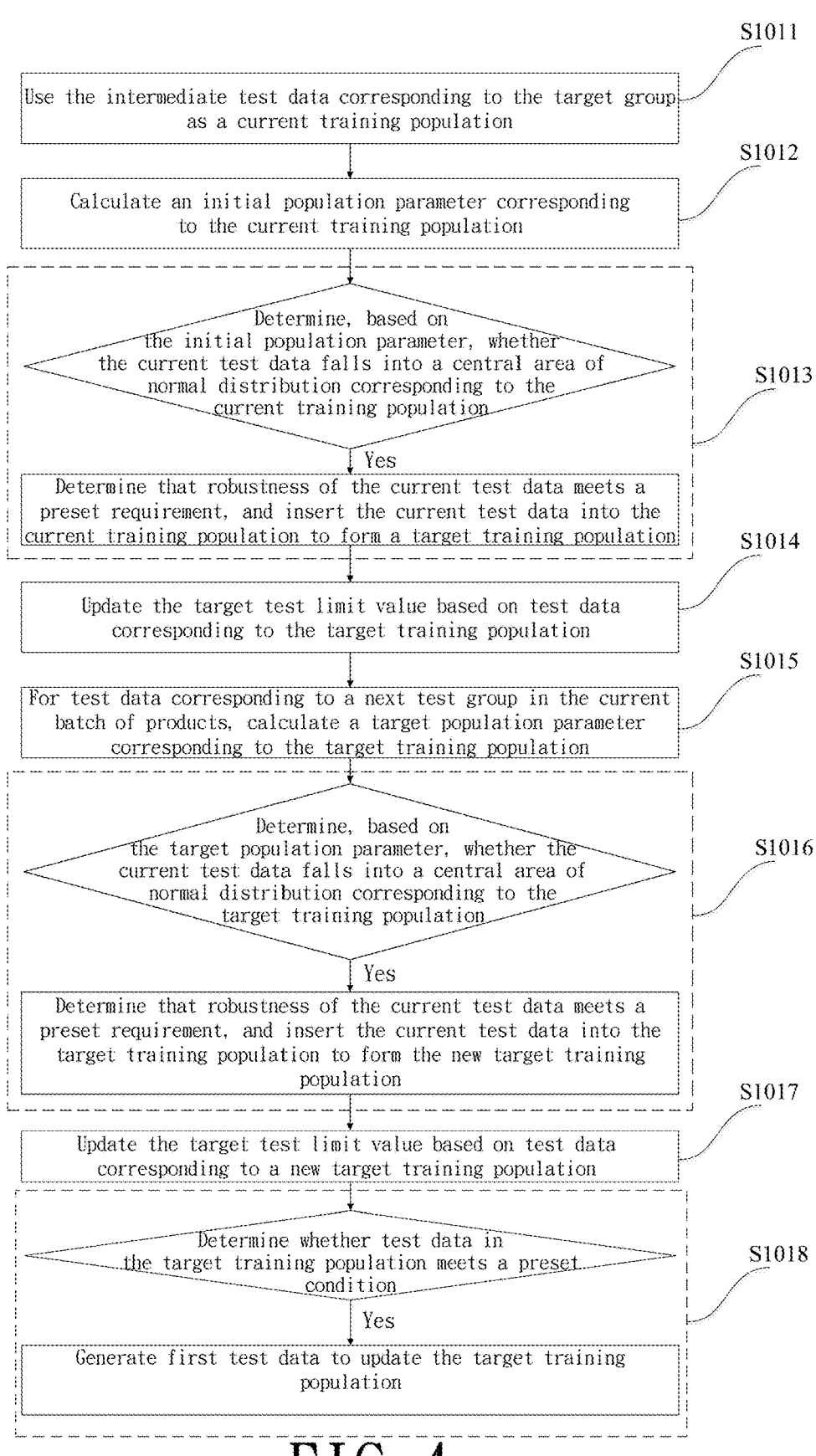

S1011

Use the intermediate test data corresponding to the target group as a current training population

S1012

Calculate an initial population parameter corresponding to the current training population Determine, based on the initial population parameter, whether the current test data falls into a central area of normal distribution corresponding to the current training population

S1013

Yes

Determine that robustness of the current test data meets a preset requirement, and insert the current test data into the current training population to form a target training population

S1014

Update the target test limit value based on test data corresponding to the target training population

S1015

For test data corresponding to a next test group in the current batch of products, calculate a target population parameter corresponding to the target training population Determine, based on the target population parameter, whether the current test data falls into a central area of normal distribution corresponding to the target training population

S1016

Yes

Determine that robustness of the current test data meets a preset requirement, and insert the current test data into the target training population to form the new target training population

S1017

Update the target test limit value based on test data corresponding to a new target training population Determine whether test data in the target training population meets a preset condition

S1018

Yes

Generate first test data to update the target training population

FIG. 4

| Training population before updating (n) |
| --- |
| Test data [0] |
| Test data [1] |
| Test data [2] |
| ● ● ● |
| Test data [n-1] |

| Updated training population (n) |
| --- |
| Test data [0] |
| Test data [1] |
| New test data |
| ● ● ● |
| Test data [n-1] |

DETECTION METHOD, SYSTEM, ELECTRONIC EQUIPMENT, AND STORAGE MEDIUM OF PRODUCT TEST DATA

CROSS-REFERENCE TO RELATED APPLICATIONS

This application is a continuation of International Application No. PCT/CN2021/104882, filed on Jul. 7, 2021, which claims priority to Chinese Application No. 202011007511.8, filed on Sep. 23, 2020. The entire contents of the above-identified patent applications are incorporated herein by reference.

FIELD OF THE INVENTION

The present invention relates to the field of chip testing technologies, and in particular, to a detection method, a system, an electronic equipment, and a storage medium of product test data.

BACKGROUND OF THE INVENTION

In the mass production test phase of semiconductor chips, a parameter test result usually conforms to normal distribution. Currently, it is mainly determined whether a test result is within a test specification range, and if so, it is determined that the chip passes the test (that is, the chip quality is qualified). However, even if test results of some chips are within the test specification range, they may deviate from a mean value excessively. When these abnormal chips are still shipped as good products, it may affect the quality of chip manufacturing and even cause quality accidents. Therefore, the existing detection method of chip test data cannot meet a higher demand for chip production.

SUMMARY OF THE INVENTION

The technical problem to be solved in the present invention is to overcome the defect that the mass production test method of semiconductor chips in the prior art cannot meet actual requirements, and the object of the present invention is to provide a detection method, a system, an electronic equipment, and a storage medium of product test data.

The present invention solves the foregoing technical problems through the following technical solutions.

The present invention provides a detection method of product test data, where the detection method includes:

obtaining historical test data corresponding to a plurality of historical batches of products;

screening the historical test data to obtain intermediate test data;

grouping the intermediate test data based on different preset test parameters to obtain a plurality of first groups, where each of the preset test parameters is corresponding to one of the first groups;

obtaining a first distribution pattern corresponding to each of the first groups based on the intermediate test data corresponding to the first groups;

determining whether the first distribution pattern is a preset distribution pattern, and if so, using the first group corresponding to the first distribution pattern as a target group; and obtaining a target test limit value based on the intermediate test data corresponding to the target group, where the target test limit value is used to test test data of a new batch of products.

Preferably, the step of obtaining a target test limit value based on the intermediate test data corresponding to the target group includes:

calculating a statistical parameter corresponding to the target group based on the intermediate test data corresponding to the target group, where the statistical parameter includes a mean value and a mean square error; and calculating an upper test limit value and a lower test limit value based on the statistical parameter and a preset constraint condition, and using the upper test limit value and the lower test limit value as the target test limit value.

Preferably, after the step of obtaining a target test limit value based on the intermediate test data corresponding to the target group, the method further includes:

obtaining current test data corresponding to a current test group in a current batch of products;

obtaining, in the current test data, a plurality of groups of target test data corresponding to the different preset test parameters;

determining whether the target test data is within the corresponding target test limit value, and if so, determining the target test data as normal test data; if not, determining the target test data as abnormal test data; and when a set amount of the target test data are all normal test data, determining that the current test data of the current test group passes detection; otherwise, determining that the current test data of the current test group fails the detection.

Preferably, when it is determined that the current test data corresponding to the current test group in the current batch of products passes the detection, and the preset distribution pattern is normal distribution, the detection method further includes:

using the intermediate test data corresponding to the target group as a current training population;

calculating an initial population parameter corresponding to the current training population;

determining, based on the initial population parameter, whether the current test data falls into a central area of normal distribution corresponding to the current training population, if so, determining that robustness of the current test data meets a preset requirement, and inserting the current test data into the training population to form a target training population;

updating the target test limit value based on test data corresponding to the target training population;

for test data corresponding to a next test group in the current batch of products, calculating a target population parameter corresponding to the target training population;

determining, based on the target population parameter, whether the current test data falls into a central area of normal distribution corresponding to the target training population, if so, determining that robustness of the current test data meets a preset requirement, and inserting the current test data into the target training population to form the new target training population; and updating the target test limit value based on test data corresponding to the new target training population.

Preferably, the detection method further includes:

determining whether test data in the target training population meets a preset condition, and if so, generating first test data to update the target training population, where

3 a statistical parameter difference between the target training population before updating and the updated target training population is less than a first set threshold, and test data corresponding to the updated target training population does not meet the preset condition; the statistical parameter includes a mean value and a mean square error.

Preferably, the step of determining whether test data in the target training population meets a preset condition, and if so, generating first test data to update the target training population includes:

obtaining a quartile corresponding to the test data in the target training population; and determining whether a first quartile in the quartile is equal to a third quartile, and if so, randomly generating the first test data to update the target training population.

Preferably, the step of randomly generating the first test data to update the target training population includes:

using at least one of an inverse function sampling method, a Box-Muller transform method (a method for generating random numbers in normal distribution), and a central limit theorem to randomly generate a group of second test data respectively, calculating a difference between a statistical parameter corresponding to each group of the second test data and a statistical parameter of the target training population before updating, and selecting the second test data corresponding to a minimum absolute value of the difference as the first test data to update the target training population.

Preferably, the step of screening the historical test data to obtain intermediate test data includes:

screening third test data corresponding to all the preset test parameters from the historical test data; and removing test data exceeding a preset test limit value from the third test data to obtain the intermediate test data.

Preferably, the step of grouping the intermediate test data based on different preset test parameters to obtain a plurality of first groups includes:

grouping the intermediate test data based on the different preset test parameters to obtain a plurality of intermediate groups; and determining whether a size of the intermediate group is greater than or equal to a second set threshold, and if so, using the intermediate group as the first group.

Preferably, before the step of obtaining historical test data corresponding to a plurality of historical batches of products, the method further includes:

establishing a static data space in advance;

after the step of obtaining historical test data corresponding to a plurality of historical batches of products, and before the step of screening the historical test data to obtain intermediate test data, the method includes:

obtaining the historical test data in a set format, decoding the historical test data, and storing the decoded historical test data in the static data space; and the step of screening third test data corresponding to all the preset test parameters from the historical test data includes:

outputting the third test data from the static data space through different APIs (application program interface) based on all the preset test parameters.

The present invention further provides a detection system of product test data, where the detection system includes:

a historical data obtaining module, configured to obtain historical test data corresponding to a plurality of historical batches of products;

an intermediate data obtaining module, configured to screen the historical test data to obtain intermediate test data;

a group obtaining module, configured to group the intermediate test data based on different preset test parameters to obtain a plurality of first groups, where each of the preset test parameters is corresponding to one of the first groups;

a distribution pattern obtaining module, configured to obtain a first distribution pattern corresponding to each of the first groups based on the intermediate test data corresponding to the first groups;

a first judging module, configured to: determine whether the first distribution pattern is a preset distribution pattern, and if so, use the first group corresponding to the first distribution pattern as a target group; and a test limit value obtaining module, configured to obtain a target test limit value based on the intermediate test data corresponding to the target group, where the target test limit value is used to test test data of a new batch of products.

Preferably, the test limit value obtaining module includes:

a parameter calculation unit, configured to calculate a statistical parameter corresponding to the target group based on the intermediate test data corresponding to the target group, where the statistical parameter includes a mean value and a mean square error; and a test limit value calculation unit, configured to: calculate an upper test limit value and a lower test limit value based on the statistical parameter and a preset constraint condition, and use the upper test limit value and the lower test limit value as the target test limit value.

Preferably, the detection system further includes:

a current data obtaining module, configured to obtain current test data corresponding to a current test group in a current batch of products;

a target data obtaining module, configured to obtain, in the current test data, a plurality of groups of target test data corresponding to the different preset test parameters;

a second judging module, configured to determine whether the target test data is within the corresponding target test limit value, and if so, determine the target test data as normal test data; if not, determine the target test data as abnormal test data; and a determining module, configured to: when a set amount of the target test data are all normal test data, determine that the current test data of the current test group passes detection; otherwise, determine that the current test data of the current test group fails the detection.

Preferably, when it is determined that the current test data corresponding to the current test group in the current batch of products passes the detection, and the preset distribution pattern is normal distribution, the detection system further includes:

a current population obtaining module, configured to use the intermediate test data corresponding to the target group as a current training population;

a population parameter calculation module, configured to calculate an initial population parameter corresponding to the current training population;

a third judging module, configured to: determine, based on the initial population parameter, whether the current test data falls into a central area of normal distribution corresponding to the current training population, if so, determine that robustness of the current test data meets a preset requirement, and insert the current test data into the training population to form a target training population;

a test limit value updating module, configured to update the target test limit value based on test data corresponding to the target training population;

for test data corresponding to a next test group in the current batch of products, the population parameter calculation module is further configured to calculate a target population parameter corresponding to the target training population;

the third judging module is configured to: determine, based on the target population parameter, whether the current test data falls into a central area of normal distribution corresponding to the target training population, if so, determine that robustness of the current test data meets a preset requirement, and insert the current test data into the target training population to form the new target training population; and the test limit value updating module is further configured to update the target test limit value based on test data corresponding to the new target training population.

Preferably, the detection system further includes:

a fourth judging module, configured to determine whether test data in the target training population meets a preset condition, and if so, generate first test data to update the target training population, where a statistical parameter difference between the target training population before updating and the updated target training population is less than a first set threshold, and test data corresponding to the updated target training population does not meet the preset condition; the statistical parameter includes a mean value and a mean square error.

Optionally, the fourth judging module includes:

a quartile obtaining unit, configured to obtain a quartile corresponding to the test data in the target training population;

a first judging unit, configured to: determine whether a first quartile in the quartile is equal to a third quartile, and if so, invoke the generating unit; and a generating unit, configured to randomly generate the first test data to update the target training population.

Preferably, the generating unit uses at least one of an inverse function sampling method, a Box-Muller transform method, and a central limit theorem to randomly generate a group of second test data respectively, calculates a difference between a statistical parameter corresponding to each group of the second test data and a statistical parameter of the target training population before updating, and selects the second test data corresponding to a minimum absolute value of the difference as the first test data to update the target training population.

Preferably, the intermediate data obtaining module includes:

a screening unit, configured to screen third test data corresponding to all the preset test parameters from the historical test data; and a removing unit, configured to remove test data exceeding a preset test limit value from the third test data to obtain the intermediate test data.

Preferably, the group obtaining module includes:

a grouping unit, configured to group the intermediate test data based on the different preset test parameters to obtain a plurality of intermediate groups; and a second judging unit, configured to: determine whether a size of the intermediate group is greater than or equal to a second set threshold, and if so, use the intermediate group as the first group.

Preferably, the detection system includes:

a data space establishment module, configured to establish a static data space in advance;

a storage module, configured to: obtain the historical test data in a set format, decode the historical test data, and store the decoded historical test data in the static data space; and the screening unit is configured to output the third test data from the static data space through different APIs based on all the preset test parameters.

The present invention further provides an electronic equipment, including a memory, a processor, and a computer program stored in the memory and executable on the processor, where when the computer program is executed by the processor, the detection method of product test data is implemented.

The present invention further provide a computer readable storage medium, having a computer program stored thereon, where when the computer program is executed by a processor, steps of the detection method of product test data are implemented.

On the basis of meeting the common knowledge in the field, the foregoing preferred conditions can be arbitrarily combined to obtain preferred examples of the present invention.

The positive progressive effects of the present invention are as follow.

In the present invention, filtering, grouping, and other processing are performed based on collected historical test data of several historical batches of products and a preset test parameter (such as a test item), and the target group is screened out based on the distribution pattern of the test data in each group to calculate the initial test limit value. That is, a key limit value is tightened before a new batch of products is detected, so as to ensure an accuracy of detecting test data of the new batch of products, thereby improving test quality of the chip. When robustness of the test data of the new batch of products meets a set condition, the current test data is inserted into a previous training population to form a new training population, and then a new dynamic test limit value is obtained through updating. That is, the test limit value can be adjusted dynamically and adaptively, and chip test data with abnormal data can be effectively detected in real time, thereby improving test quality of the chip.

BRIEF DESCRIPTION OF THE DRAWINGS

FIG. 1 is a flowchart of a detection method of product test data according to Embodiment 1 of the present invention;

FIG. 3 is a first flowchart of a detection method of product test data according to Embodiment 2 of the present invention;

FIG. 4 is a second flowchart of a detection method of product test data according to Embodiment 2 of the present invention;

7

Figures 5, 6:
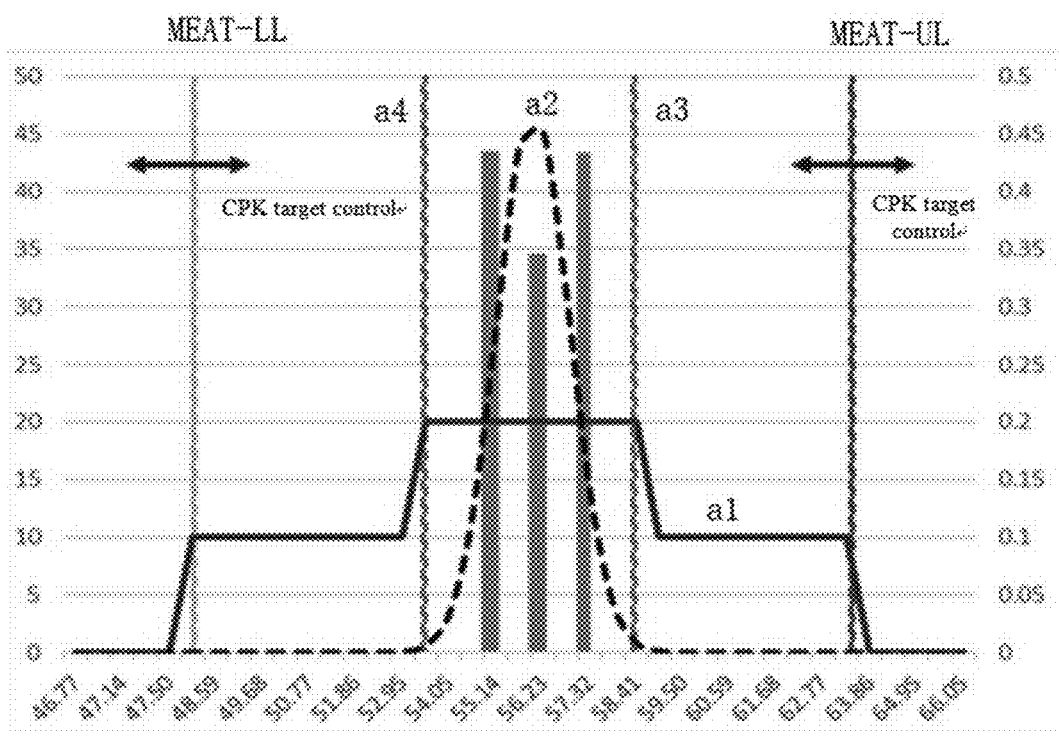
FIG. 5 is a schematic diagram of normal distribution of a training population in a detection method of product test data according to Embodiment 2 of the present invention.
Figure 7:
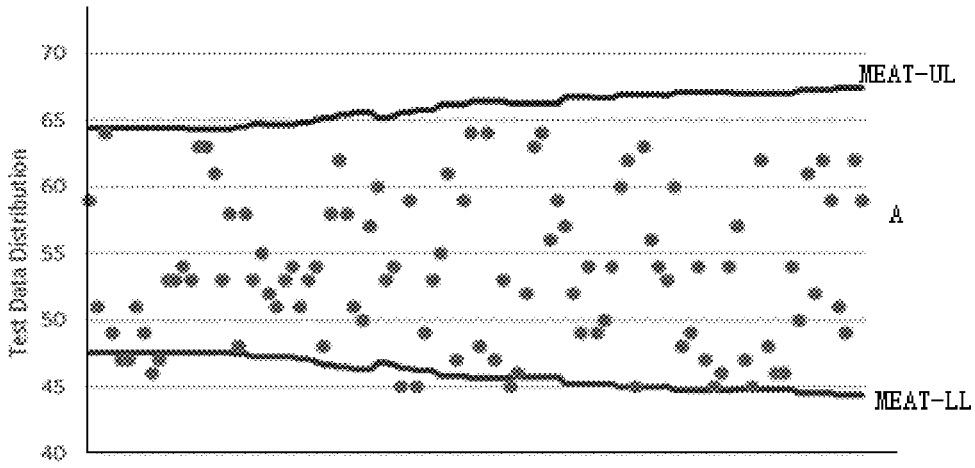
Figure 8:
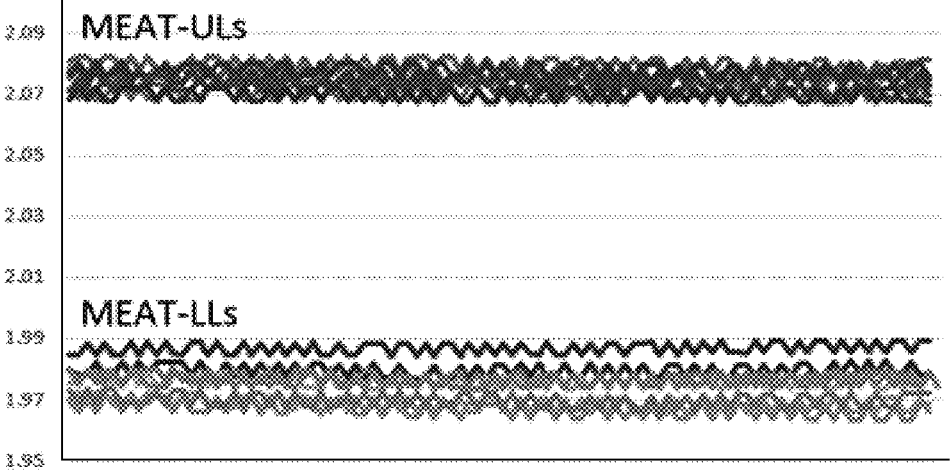
Figure 9:
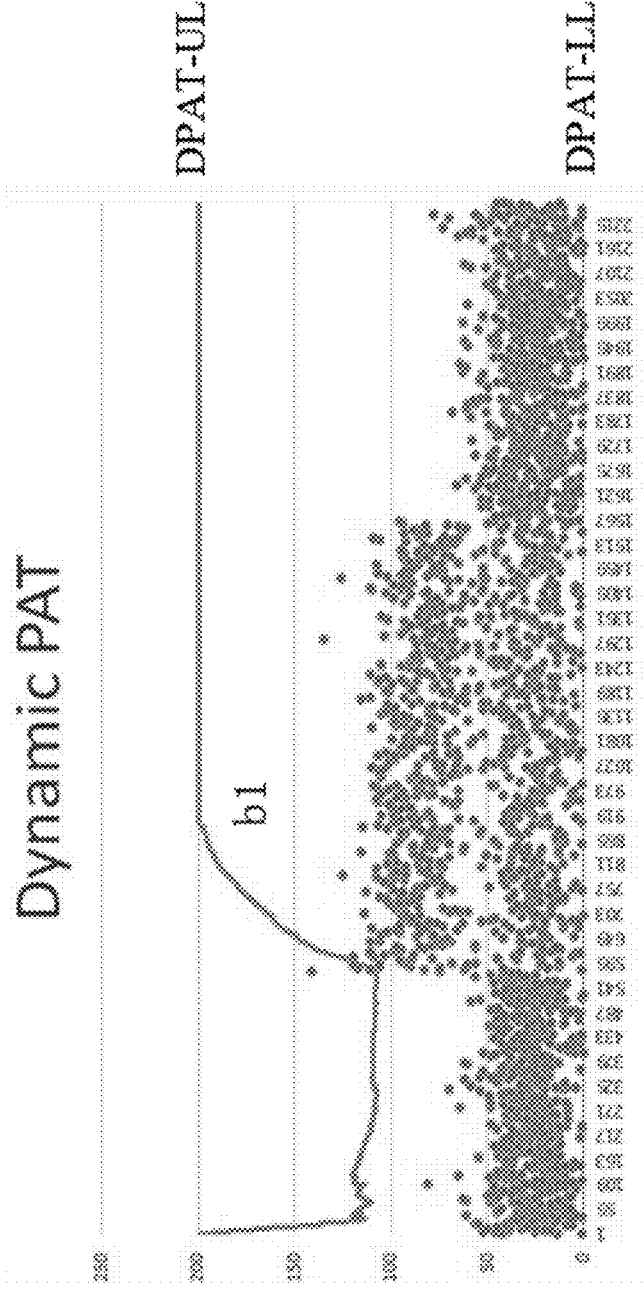
Figure 10:
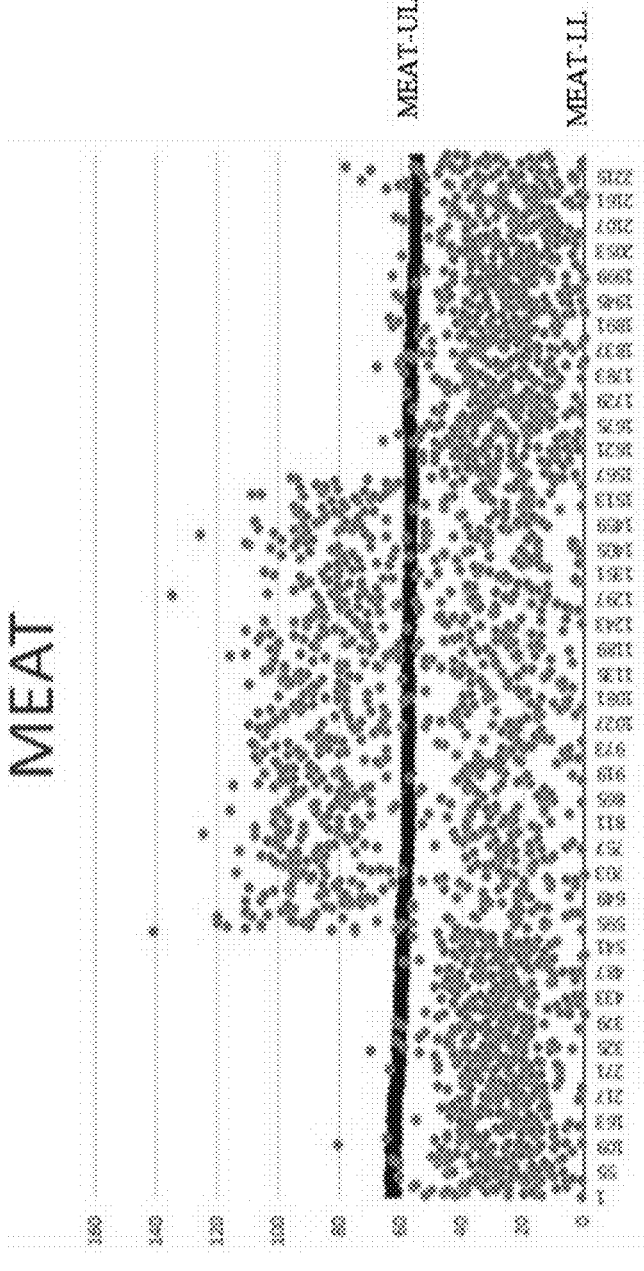
Figure 11:
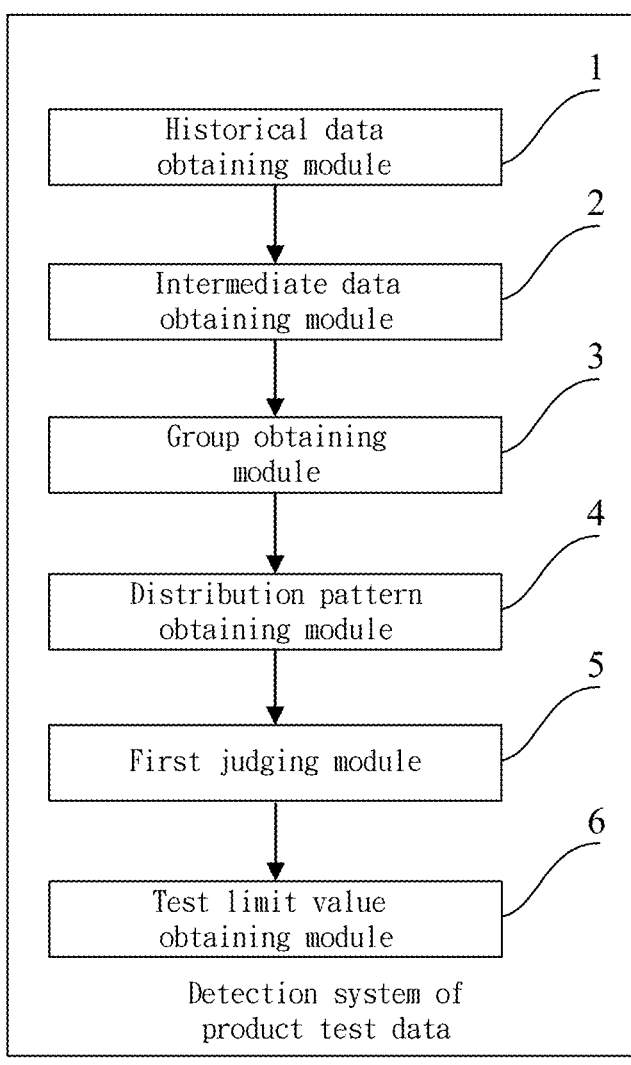
Figure 12:
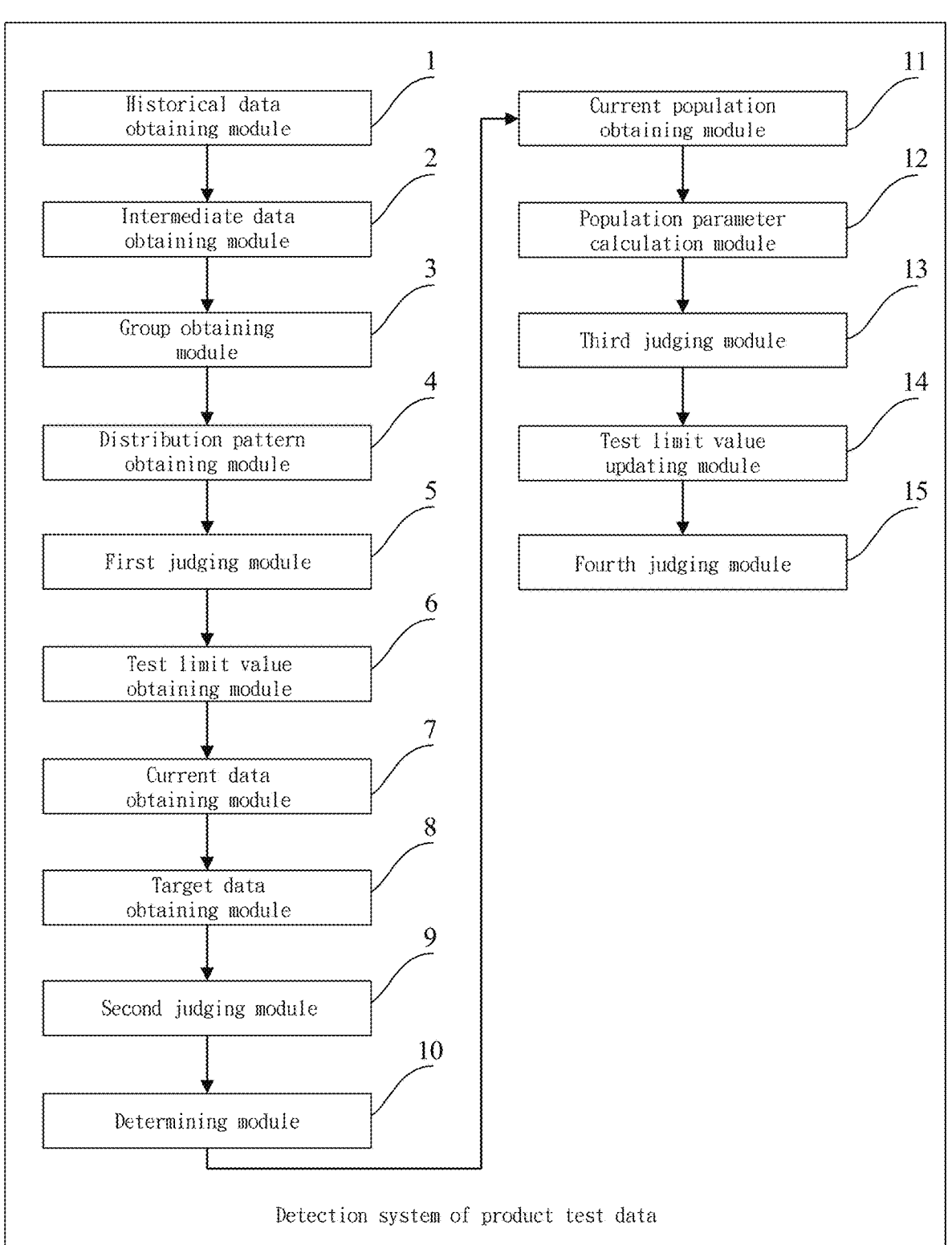
Figure 13:
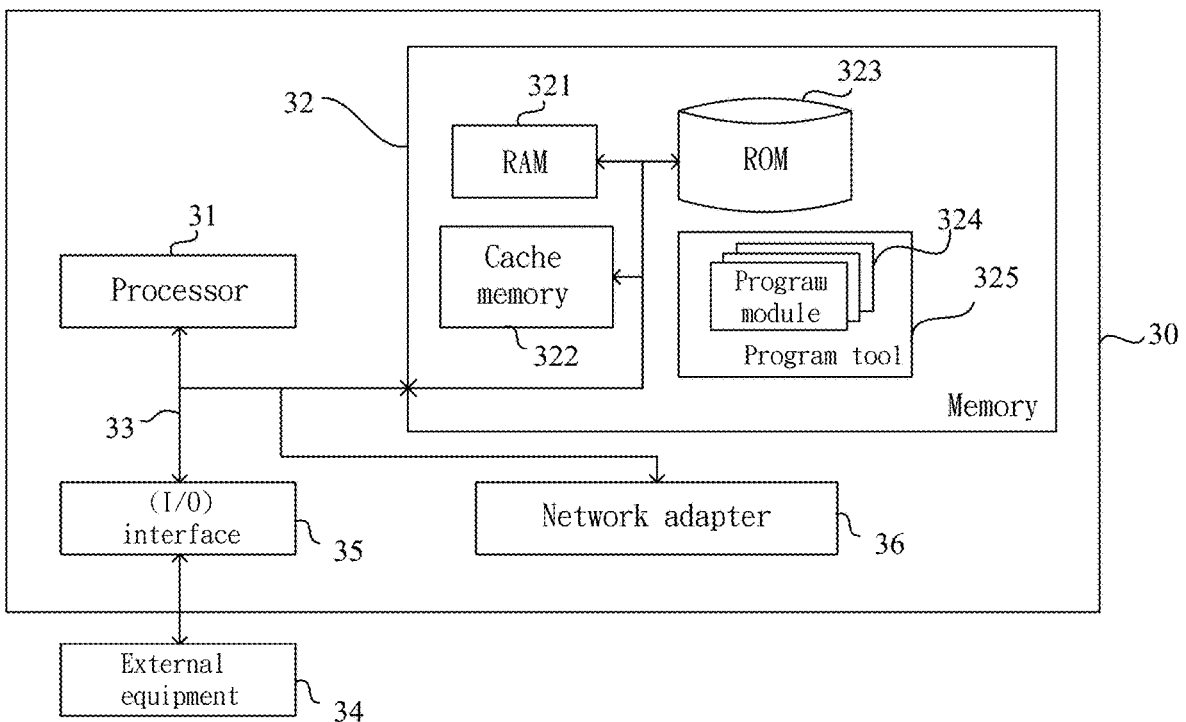

FIG. 6 is a schematic diagram of a process of generating a new training population in a detection method of product test data according to Embodiment 2 of the present invention;

FIG. 7 is a schematic diagram of a first test in a detection method of product test data according to Embodiment 2 of the present invention;

FIG. 8 is a schematic diagram of a second test in a detection method of product test data according to Embodiment 2 of the present invention;

FIG. 9 is a schematic diagram of a detection result corresponding to an existing dynamic DPAT detection method;

FIG. 10 is a schematic diagram of a detection result corresponding to a detection method of product test data according to Embodiment 2 of the present invention;

FIG. 11 is a schematic diagram of a module in a detection system of product test data according to Embodiment 3 of the present invention;

FIG. 12 is a schematic diagram of a module in a detection system of product test data according to Embodiment 4 of the present invention; and FIG. 13 is a schematic structural diagram of an electronic equipment implementing a detection method of product test data according to Embodiment 5 of the present invention.

DETAILED DESCRIPTION OF PREFERRED EMBODIMENTS

The present invention is further described by using the following embodiments, but the present invention is not limited to the scope of the embodiments.

Embodiment 1

As shown in FIG. 1, the detection method of product test data in this embodiment includes the following steps.

S101. Obtain historical test data corresponding to a plurality of historical batches of products.

In an implementable manner, the historical test data is test data of at least six historical batches of products passing a test limit value defined by the equipment specification, and each batch of products includes at least 30 detection parameters, where both a quantity of historical batches of products corresponding to the historical test data and a quantity of detection parameters in each batch of products can be re-determined and re-adjusted based on the actual situation.

Generally, the historical test data is stored as an STDF (Standard Test Data Format) file, which belongs to a batch production test data file; certainly, the historical test data may also be stored as files in other formats based on the actual situation.

In addition, it is necessary to establish a static data space in memory in advance, and once the static data space is established, a batch production test procedure can be started.

At the beginning of detection, the STDF file corresponding to the historical test data is initialized, and an STDF content corresponding to the STDF file is decoded and stored in the static data space, where the decoded STDF content is ASCII data.

S102. Screen the historical test data to obtain intermediate test data.

Third test data corresponding to all the preset test parameters is screen from the historical test data, and test data exceeding a preset test limit value is removed from the third test data to obtain the intermediate test data.

Specifically, the third test data is output from the static data space through different APIs based on all the preset test parameters. The preset test parameters include, but are not limited to, test items or sites in a plurality of homologous application programs.

In addition, it is necessary to manually or automatically check whether the distribution of all the obtained intermediate test data is reasonable, and exclude obviously unreasonable test data, so as to ensure the accuracy and reliability of determining the later test limit value.

S103. Group the intermediate test data based on different preset test parameters to obtain a plurality of first groups, where each of the preset test parameters is corresponding to one of the first groups.

Specifically, the intermediate test data is grouped based on different preset test parameters to obtain a plurality of intermediate groups, and it is determined whether a size of the intermediate group is greater than or equal to a second set threshold; if so, the intermediate group is used as the first group, that is, a group including less data is removed, so that an overall calculation amount is reduced, calculation efficiency is improved, and overall detection efficiency is further improved.

S104. Obtain a first distribution pattern corresponding to each of the first groups based on the intermediate test data corresponding to the first groups.

S105. Determine whether the first distribution pattern is a preset distribution pattern, and if so, use the first group corresponding to the first distribution pattern as a target group.

The preset distribution pattern includes normal distribution, that is, by comparing distribution patterns, groups of other distribution patterns such as 0-1 distribution is removed, and only the group in normal distribution is kept, thus ensuring the accuracy and reliability of determining the later test limit value.

S106. Obtain a target test limit value based on the intermediate test data corresponding to the target group.

The target test limit value is used to perform mass production test on test data of a new batch of products. As a first dynamic limit value, the target test limit value ensures that the key limit value is tightened before the new batch of products is tested, and ensures the accuracy of determining the test data of the new batch of products.

Specifically, a statistical parameter corresponding to the target group is calculated based on the intermediate test data corresponding to the target group, where the statistical parameter includes a mean value and a mean square error.

An upper test limit value and a lower test limit value are calculated based on the statistical parameter and a preset constraint condition (a CPK constraint condition, namely, a process capability index), and the upper test limit value and the lower test limit value are used as target test limit values.

For example:

$$\text{Dynamic } UL = \begin{cases} \bar{x} + CPK \times 3\sigma & \text{(if } UL < USL) \\ USL & \text{(if } UL \geq USL) \end{cases}$$

$$\text{Dynamic } LL = \begin{cases} \bar{x} - CPK \times 3\sigma & \text{(if } LL > LSL) \\ LSL & \text{(if } LL \leq LSL) \end{cases}$$

$\bar{x}$ represents the mean value, $\sigma$ represents the mean square error, CPK is the preset constraint condition, Dynamic UL represents the upper test limit value, and Dynamic LL represents the lower test limit value.

Figure 2:
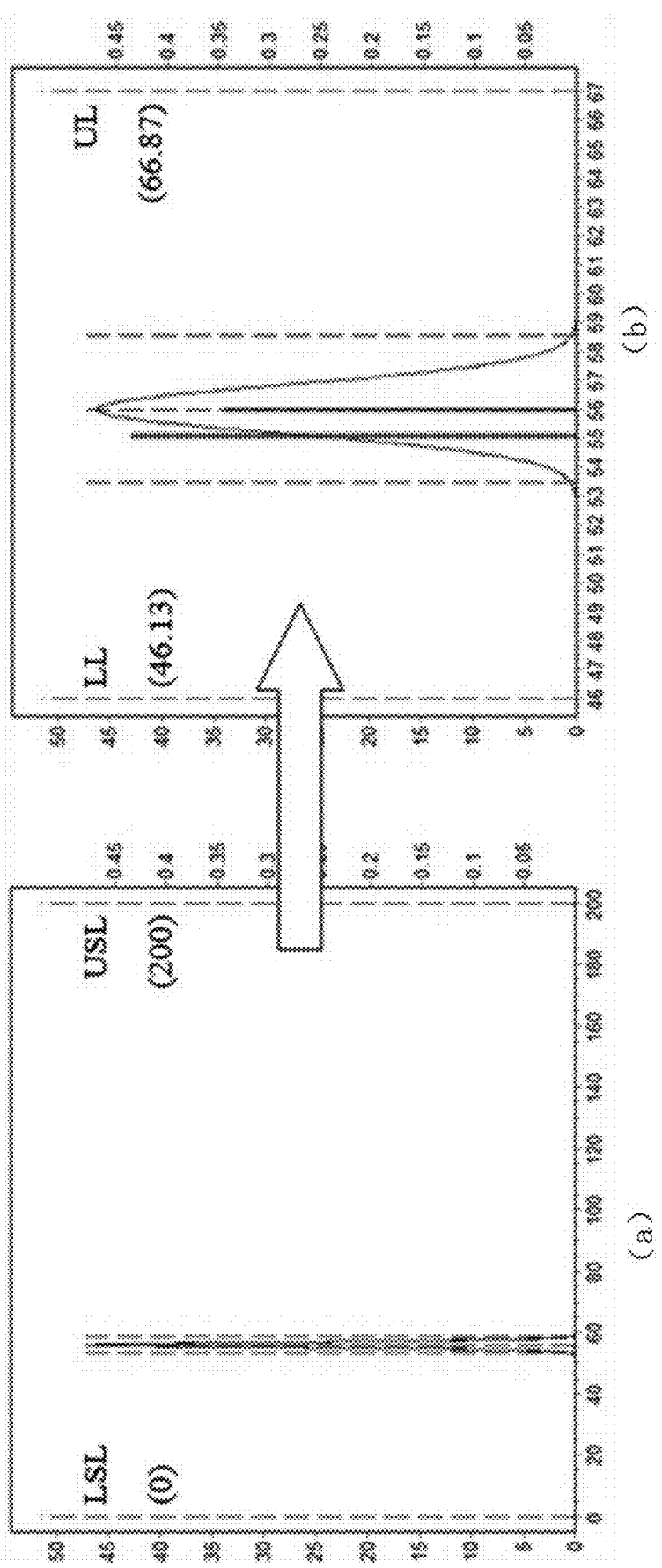
FIG. 2 is a schematic diagram of a test limit value in a detection method of product test data according to Embodiment 1 of the present invention.

In an implementable manner, as shown in (a) of FIG. 2, the test limit value [0, 200] is obtained only based on the design specification of the product to be tested; as shown in (b) of FIG. 2, when the upper test limit value and the lower test limit value [46.13, 67.87] is calculated based on the statistical parameter and the CPK constraint condition (±CPK*sigma, where sigma represents the mean square error), a tighter test limit value can be calculated based on the CPK constraint condition to ensure the test quality of the chip.

In this embodiment, filtering, grouping, and other processing are performed based on collected historical test data of several historical batches of products and a preset test parameter (such as a test item), and the target group is screened out based on the distribution pattern of the test data in each group to calculate the test limit value, so that a key limit value is tightened before a new batch of products is detected, so as to ensure an accuracy of detecting test data of the new batch of products, thereby improving test quality of the chip.

Embodiment 2

As shown in FIG. 3, the detection method of product test data in this embodiment is a further improvement over Embodiment 1, specifically:

After step S106, the method further includes the following steps.

S107. Obtain current test data corresponding to a current test group in a current batch of products.

S108. Obtain, in the current test data, a plurality of groups of target test data corresponding to the different preset test parameters.

S109. Determine whether the target test data is within the corresponding target test limit value, and if so, determine the target test data as normal test data; if not, determine the target test data as abnormal test data.

S1010. When a set amount of the target test data are all normal test data, determine that the current test data of the current test group passes detection; otherwise, determine that the current test data of the current test group fails the detection.

The set amount of the target test data may be all amount of the target test data, or may be specifically determined based on the actual situation. For example, when 98 of 100 pieces of target test data are normal test data, it is determined that the current test data in the current test group passes the detection.

As shown in FIG. 4, when it is determined that the current test data corresponding to the current test group in the current batch of products passes the detection, and the preset distribution pattern is normal distribution, after step S1010, the method further includes the following steps.

S1011. Use the intermediate test data corresponding to the target group as a current training population.

S1012. Calculate an initial population parameter corresponding to the current training population.

S1013. Determine, based on the initial population parameter, whether the current test data falls into a central area of normal distribution corresponding to the current training population, if so, determine that robustness of the current test data meets a preset requirement, and insert the current test data into the current training population to form a target training population.

S1014. Update the target test limit value based on test data corresponding to the target training population.

As shown in FIG. 5, a1 represents the adaptability of data, a2 represents normal fitting (normal distribution fitting curve), a3 represents+3sigma, a4 represents −3sigma, MEAT-LL represents the lower test limit value, and MEAT-UL represents the upper test limit value.

When the current test data falls into the central area of normal distribution corresponding to the current training population, it indicates that the robustness (adaptability) of the current test data is strong enough; As shown in FIG. 6, in this case, the current test data is inserted into the previous training population to form a new training population, to be corresponding to a new statistical parameter, thereby dynamically establishing a new target test limit value.

In a batch test stage of the chip, an adaptive function is used to continuously monitor test data of each chip, and with the continuous development of the training population, the purpose of adaptive testing can be achieved.

S1015. For test data corresponding to a next test group in the current batch of products, calculate a target population parameter corresponding to the target training population.

S1016. Determine, based on the target population parameter, whether the current test data falls into a central area of normal distribution corresponding to the target training population, if so, determine that robustness of the current test data meets a preset requirement, and insert the current test data into the target training population to form the new target training population.

For the same preset test parameter, when the corresponding test data in the current test data meets the robustness requirement, the corresponding test data in the current test data is inserted into the previous training population to form the target training population.

Specifically, the robustness may be determined by the following formula:

$$\text{Robustness} = \begin{cases} \text{Strong} & (\text{if } \text{data}_{test} \in [\bar{x} - 2\sigma, \bar{x} + 2\sigma]) \\ \text{Weak} & (\text{else}) \end{cases}$$

S1017. Update the target test limit value based on test data corresponding to the new target training population. Specifically, a corresponding statistical parameter is calculated based on the test data corresponding to the new target training population, and finally the new target test limit value is calculated based on the CPK constraint condition.

The target test limit value is updated in time by using the test data corresponding to the new test group in the same batch of products to ensure the test quality of the chip.

That is, according to this embodiment, in a process of automatic test of mass production, the test data of the current chip is continuously used as a new individual to be compared with a population array through the fitness function, to evaluate the robustness thereof.

The detection method in this embodiment belongs to a real-time test data monitoring algorithm based on evolution theory, which is referred to as MEAT (monitoring evolutionary algorithm during testing). This algorithm combines characteristics of the static PAT (guide to parts average test) and characteristics of the dynamic PAT, and introduces the CPK constraint condition and evolution strategy to achieve high-quality testing of the consumer chip.

As shown in FIG. 7, the horizontal axis represents a test data sequence, the vertical axis represents a test data distribution, LL represents the lower test limit value, UL represents the upper test limit value, and a dot in an area A represents each current test data. It can be learned that the current test data is detected based on the obtained target test limit value.

In addition, when the preset test parameter includes a test item, MEAT monitors each test item as a single training population; and when the preset test parameter includes sites in a plurality of homologous application programs, MEAT monitors each site in the plurality of homologous application programs as a single training population. As shown in FIG. 8, for a dynamic limit value under a multi-site application, each site has an independent limit value line.

In addition, after step S1017, the method further includes the following steps.

S1018. Determine whether test data in the target training population meets a preset condition, and if so, generate first test data to update the target training population.

A statistical parameter difference between the target training population before updating and the updated target training population is less than a first set threshold, and test data corresponding to the updated target training population does not meet the preset condition; the statistical parameter includes a mean value and a mean square error.

Step S1018 specifically includes:

obtaining a quartile corresponding to the test data in the target training population; and determining whether a first quartile in the quartile is equal to a third quartile, and if so, randomly generating the first test data to update the target training population.

Specifically, at least one of an inverse function sampling method, a Box-Muller transform method, and a central limit theorem is used to randomly generate a group of second test data respectively, a difference between a statistical parameter corresponding to each group of the second test data and a statistical parameter of the target training population before updating is calculated, and the second test data corresponding to a minimum absolute value of the difference is selected as the first test data to update the target training population. Certainly, the test data may also be generated by using a method for randomly generating data.

Randomly generated test data is used to replace test data in the original target training population, so as to effectively avoid the local convergence of the population in the evolution process, which makes UL and LL too close, thus ensuring the reliability of the dynamic test limit value.

The detection method MEAT in this embodiment does not need to be based on other information other than the foregoing content, such as coordinates of grains on the wafer, thus improving the detection efficiency and accuracy of the existing product detection method.

The following descriptions are provided with reference to examples:

As shown in FIG. 9, FIG. 9 is a detection result for detecting the test data based on the existing dynamic PAT (dynamic PAT) test method. The horizontal axis represents the test data sequence, and the vertical axis represents the test data distribution. DPAT-LL represents the lower test limit value, and DPAT-UL represents the upper test limit value. At b1 in the figure, because of continuous abnormal data in the test data, the DPAT-UL also rises obviously. It can be learned that this detection method is highly dependent on the test data, so continuous release of data may have a great impact on a detection mechanism thereof, and may even lose its effectiveness.

As shown in FIG. 10, FIG. 10 is a detection result for detecting the test data based on the MEAT detection method. The horizontal axis represents the test data sequence, and the vertical axis represents the test data distribution. MEAT-LL represents the lower test limit value, and MEAT-UL represents the upper test limit value. It can be learned that in the MEAT detection method, it is determined whether to perform population evolution based on data robustness, which reduces the sensitivity of the dynamic limit value of MEAT to the test data, and has a more reasonable mechanism to reduce dependence on the test data. In this detection method, data can even be released continuously to tighten the dynamic limit value effectively and strictly in the production process.

Comparison data of detection results between the dynamic DPAT detection method and the MEAT detection method in this embodiment is as follows:

| Quantity of chips to be tested | DPPM | Quantity of failed chips | DPAT outlier | MEAT outlier |
|---|---|---|---|---|
| 11440 | 50874 | 582 | 4 | 515 |

It can be learned from the foregoing table that the quantity of chips to be tested is 11,440 and the quantity of failed chips is 582, then the DPPM (part per million of defect rate) of this batch of chips=(582/11,440)*1,000,000=50,874.

The existing DPAT detection method can be used to only detect 4 pieces of abnormal test data from 582 pieces of published data, and a corresponding detection rate=(4/582)*100%=0.69%, while the MEAT outlier in this embodiment can be used to detect 515 pieces of abnormal test data from 582 pieces of published data, and a corresponding detection rate=(515/582)*100%.=88.49%.

Therefore, the test data detection method in this embodiment can be used to effectively analyze abnormal test data, thus effectively improving the test quality of the chip.

In addition, the experiment proves that the MEAT detection method in this embodiment covers more than 95% of the unit tests of C++ version and Java version. Even the MEAT detection method may also be applied to data consistency check across operating systems and programming languages, so as to realize the creation and real-time storage of traceable adaptive data.

In this embodiment, filtering, grouping, and other processing are performed based on collected historical test data of several historical batches of products and a preset test parameter (such as a test item), and the target group is screened out based on the distribution pattern of the test data in each group to calculate the initial test limit value. When robustness of the test data of the new batch of products meets a set condition, the current test data is inserted into a previous training population to form a new training population, and then a new dynamic test limit value is obtained through updating. That is, in the MEAT detection method, the population evolution is monitored based on data robustness (fitness/robustness), so that the test limit value can be adjusted dynamically and adaptively, and chip test data with abnormal data can be effectively detected in real time, thereby improving test quality of the chip.

Embodiment 3

As shown in FIG. 11, a detection system of product test data in this embodiment includes a historical data obtaining module 1, an intermediate data obtaining module 2, a group obtaining module 3, a distribution pattern obtaining module 4, a first judging module 5, and a test limit value obtaining module 6.

The historical data obtaining module 1 is configured to obtain historical test data corresponding to a plurality of historical batches of products.

In an implementable manner, the historical test data is test data of at least six historical batches of products passing a test limit value defined by the equipment specification, and each batch of products includes at least 30 detection parameters, where both a quantity of historical batches of products corresponding to the historical test data and a quantity of detection parameters in each batch of products can be re-determined and re-adjusted based on the actual situation.

Generally, the historical test data is stored as an STDF file, which belongs to a batch production test data file; certainly, the historical test data may also be stored as files in other formats based on the actual situation.

In addition, it is necessary to establish a static data space in memory in advance, and once the static data space is established, a batch production test procedure can be started.

At the beginning of detection, the STDF file corresponding to the historical test data is initialized, and an STDF content corresponding to the STDF file is decoded and stored in the static data space, where the decoded STDF content is ASCII data.

The detection system of product test data in this embodiment further includes a data space establishment module and a storage module. The data space establishment module is configured to establish a static data space in advance; and the storage module is configured to: obtain the historical test data in a set format, decode the historical test data, and store the decoded historical test data in the static data space.

The intermediate data obtaining module 2 is configured to screen the historical test data to obtain intermediate test data, where the intermediate data obtaining module 2 includes a screening unit and a removing unit.

The screening unit is configured to screen third test data corresponding to all the preset test parameters from the historical test data; and the removing unit is configured to remove test data exceeding a preset test limit value from the third test data to obtain the intermediate test data.

Specifically, the third test data is output from the static data space through different APIs based on all the preset test parameters. The preset test parameters include, but are not limited to, test items or sites in a plurality of homologous application programs.

In addition, it is necessary to manually or automatically check whether the distribution of all the obtained intermediate test data is reasonable, and exclude obviously unreasonable test data, so as to ensure the accuracy and reliability of determining the later test limit value.

The group obtaining module 3 is configured to group the intermediate test data based on different preset test parameters to obtain a plurality of first groups, where each of the preset test parameters is corresponding to one of the first groups.

Specifically, the group obtaining module 3 includes a grouping unit and a second judging unit.

The grouping unit is configured to group the intermediate test data based on the different preset test parameters to obtain a plurality of intermediate groups; and the second judging unit is configured to: determine whether a size of the intermediate group is greater than or equal to a second set threshold, and if so, use the intermediate group as the first group. That is, a group including less data is removed, so that an overall calculation amount is reduced, calculation efficiency is improved, and overall detection efficiency is further improved.

The distribution pattern obtaining module 4 is configured to obtain a first distribution pattern corresponding to each of the first groups based on the intermediate test data corresponding to the first groups; and the first judging module 5 is configured to: determine whether the first distribution pattern is a preset distribution pattern, and if so, use the first group corresponding to the first distribution pattern as a target group, where the preset distribution pattern includes normal distribution, that is, by comparing distribution patterns, groups of other distribution patterns such as 0-1 distribution is removed, and only the group in normal distribution is kept, thus ensuring the accuracy and reliability of determining the later test limit value. The test limit value obtaining module 6 is configured to obtain a target test limit value based on the intermediate test data corresponding to the target group, where the target test limit value is used to test test data of a new batch of products.

As a first dynamic limit value, the target test limit value ensures that the key limit value is tightened before the new batch of products is tested, and ensures the accuracy of determining the test data of the new batch of products.

Specifically, the test limit value obtaining module 6 includes a parameter calculation unit and a test limit value calculation unit;

the parameter calculation unit is configured to calculate a statistical parameter corresponding to the target group based on the intermediate test data corresponding to the target group, where the statistical parameter includes a mean value and a mean square error; and the test limit value calculation unit is configured to: calculate an upper test limit value and a lower test limit value based on the statistical parameter and a preset constraint condition (a CPK constraint condition, namely, a process capability index), and use the upper test limit value and the lower test limit value as the target test limit value.

For example:

$$\text{Dynamic } UL = \begin{cases} \bar{x} + CPK \times 3\sigma & \text{(if } UL < USL) \\ USL & \text{(if } UL \geq USL) \end{cases}$$

$$\text{Dynamic } LL = \begin{cases} \bar{x} - CPK \times 3\sigma & \text{(if } LL > LSL) \\ LSL & \text{(if } LL \leq LSL) \end{cases}$$

$\bar{x}$ represents the mean value, $\sigma$ represents the mean square error, CPK is the preset constraint condition, Dynamic UL represents the upper test limit value, and Dynamic LL represents the lower test limit value.

In an implementable manner, as shown in (a) of FIG. 2, the test limit value [0, 200] is obtained only based on the design specification of the product to be tested; as shown in (b) of FIG. 2, when the upper test limit value and the lower test limit value [46.13, 67.87] is calculated based on the statistical parameter and the CPK constraint condition (±CPK*sigma, where sigma represents the mean square error), a tighter test limit value can be calculated based on the CPK constraint condition to ensure the test quality of the chip.

In this embodiment, filtering, grouping, and other processing are performed based on collected historical test data of several historical batches of products and a preset test parameter (such as a test item), and the target group is screened out based on the distribution pattern of the test data in each group to calculate the test limit value, so that a key limit value is tightened before a new batch of products is detected, so as to ensure an accuracy of detecting test data of the new batch of products, thereby improving test quality of the chip.

Embodiment 4

As shown in FIG. 12, the detection system of product test data in this embodiment is a further improvement over Embodiment 3, specifically:

The detection system further includes a current data obtaining module 7, a target data obtaining module 8, a second judging module 9, and a determining module 10.

The current data obtaining module 7 is configured to obtain current test data corresponding to a current test group in a current batch of products;

the target data obtaining module 8 is configured to obtain, in the current test data, a plurality of groups of target test data corresponding to the different preset test parameters;

the second judging module 9 is configured to determine whether the target test data is within the corresponding target test limit value, and if so, determine the target test data as normal test data; if not, determine the target test data as abnormal test data; and the determining module 10 is configured to: when a set amount of the target test data are all normal test data, determine that the current test data of the current test group passes detection; otherwise, determine that the current test data of the current test group fails the detection.

The set amount of the target test data may be all amount of the target test data, or may be specifically determined based on the actual situation. For example, when 98 of 100 pieces of target test data are normal test data, it is determined that the current test data in the current test group passes the detection.

When it is determined that the current test data corresponding to the current test group in the current batch of products passes the detection, and the preset distribution pattern is normal distribution, the detection system in this embodiment further includes a current population obtaining module 11, a population parameter calculation module 12, a third judging module 13, and a test limit value updating module 14.

The current population obtaining module 11 is configured to use the intermediate test data corresponding to the target group as a current training population;

the population parameter calculation module 12 is configured to calculate an initial population parameter corresponding to the current training population;

the third judging module 13 is configured to determine, based on the initial population parameter, whether the current test data falls into a central area of normal distribution corresponding to the current training population, if so, determine that robustness of the current test data meets a preset requirement, and insert the current test data into the training population to form a target training population; and the test limit value updating module 14 is configured to update the target test limit value based on test data corresponding to the target training population.

As shown in FIG. 5, when the current test data falls into the central area of normal distribution corresponding to the current training population, it indicates that the robustness (adaptability) of the current test data is strong enough; As shown in FIG. 6, in this case, the current test data is inserted into the previous training population to form a new training population, to be corresponding to a new statistical parameter, thereby dynamically establishing a new target test limit value.

In a batch test stage of the chip, an adaptive function is used to continuously monitor test data of each chip, and with the continuous development of the training population, the purpose of adaptive testing can be achieved.

For test data corresponding to a next test group in the current batch of products, the population parameter calculation module 12 is further configured to calculate a target population parameter corresponding to the target training population;

the third judging module 13 is configured to: determine, based on the target population parameter, whether the current test data falls into a central area of normal distribution corresponding to the target training population, if so, determine that robustness of the current test data meets a preset requirement, and insert the current test data into the target training population to form the new target training population, where for the same preset test parameter, when the corresponding test data in the current test data meets the robustness requirement, the corresponding test data in the current test data is inserted into the previous training population to form the target training population.

Specifically, the robustness may be determined by the following formula:

$$\text{Robustness} = \begin{cases} \text{Strong (if } \text{data}_{test} \in [\bar{x} - 2\sigma, \bar{x} + 2\sigma]) \\ \text{Weak (else)} \end{cases}$$

the test limit value updating module 14 is further configured to update the target test limit value based on test data corresponding to the new target training population.

Specifically, a corresponding statistical parameter is calculated based on the test data corresponding to the new target training population, and finally the new target test limit value is calculated based on the CPK constraint condition.

The target test limit value is updated in time by using the test data corresponding to the new test group in the same batch of products to ensure the test quality of the chip.

That is, according to this embodiment, in a process of automatic test of mass production, the test data of the current chip is continuously used as a new individual to be compared with a population array through the fitness function, to evaluate the robustness thereof.

The detection method in this embodiment belongs to a real-time test data monitoring algorithm based on evolution theory, which is referred to as MEAT. This algorithm combines characteristics of the static PAT and characteristics of the dynamic PAT, and introduces the CPK constraint condition and evolution strategy to achieve high-quality testing of the consumer chip.

As shown in FIG. 7, the horizontal axis represents a test data sequence, the vertical axis represents a test data distribution, LL represents the lower test limit value, UL represents the upper test limit value, and a dot in an area A represents each current test data. It can be learned that the current test data is detected based on the obtained target test limit value.

In addition, when the preset test parameter includes a test item, MEAT monitors each test item as a single training population; and when the preset test parameter includes sites in a plurality of homologous application programs, MEAT monitors each site in the plurality of homologous application programs as a single training population. As shown in FIG. 8, for a dynamic limit value under a multi-site application, each site has an independent limit value line.

In addition, the detection system in this embodiment further includes a fourth judging module 15;

the fourth judging module 15 is configured to determine whether test data in the target training population meets a preset condition, and if so, generate first test data to update the target training population, where a statistical parameter difference between the target training population before updating and the updated target training population is less than a first set threshold, and test data corresponding to the updated target training population does not meet the preset condition; the statistical parameter includes a mean value and a mean square error.

Specifically, the fourth judging module 15 includes a quartile obtaining unit, a first judging unit, and a generating unit.

The quartile obtaining unit is configured to obtain a quartile corresponding to the test data in the target training population;

the first judging unit is configured to: determine whether a first quartile in the quartile is equal to a third quartile, and if so, invoke the generating unit; and the generating unit is configured to randomly generate the first test data to update the target training population.

The generating unit uses at least one of an inverse function sampling method, a Box-Muller transform method, and a central limit theorem to randomly generate a group of second test data respectively, calculate a difference between a statistical parameter corresponding to each group of the second test data and a statistical parameter of the target training population before updating, and select the second test data corresponding to a minimum absolute value of the difference as the first test data to update the target training population. Certainly, the test data may also be generated by using a method for randomly generating data.

Randomly generated test data is used to replace test data in the original target training population, so as to effectively avoid the local convergence of the population in the evolution process, which makes UL and LL too close, thus ensuring the reliability of the dynamic test limit value.

The detection method MEAT in this embodiment does not need to be based on other information other than the foregoing content, such as coordinates of grains on the wafer, thus improving the detection efficiency and accuracy of the existing product detection method.

The following descriptions are provided with reference to examples:

As shown in FIG. 9, FIG. 9 is a detection result for detecting the test data based on the existing dynamic DPAT method. The horizontal axis represents the test data sequence, and the vertical axis represents the test data distribution. DPAT-LL represents the lower test limit value, and DPAT-UL represents the upper test limit value. At b1 in the figure, because of continuous abnormal data in the test data, the DPAT-UL also rises obviously. It can be learned that this detection method is highly dependent on the test data, so continuous release of data may have a great impact on a detection mechanism thereof, and may even lose its effectiveness.

As shown in FIG. 10, FIG. 10 is a detection result for detecting the test data based on the MEAT detection method. The horizontal axis represents the test data sequence, and the vertical axis represents the test data distribution. MEAT-LL represents the lower test limit value, and MEAT-UL represents the upper test limit value. It can be learned that in the MEAT detection method, it is determined whether to perform population evolution based on data robustness, which reduces the sensitivity of the dynamic limit value of MEAT to the test data, and has a more reasonable mechanism to reduce dependence on the test data. In this detection method, data can even be released continuously to tighten the dynamic limit value effectively and strictly in the production process.

Comparison data of detection results between the dynamic DPAT detection method and the MEAT detection method in this embodiment is as follows:

| Quantity of chips to be tested | DPPM | Quantity of failed chips | DPAT outlier | MEAT outlier |
|---|---|---|---|---|
| 11440 | 50874 | 582 | 4 | 515 |

It can be learned from the foregoing table that the quantity of chips to be tested is 11,440 and the quantity of failed chips is 582, then the DPPM (part per million of defect rate) of this batch of chips=(582/11,440)*1,000,000=50,874.

The existing DPAT detection method can be used to only detect 4 pieces of abnormal test data from 582 pieces of published data, and a corresponding detection rate=(4/582) *100%=0.69%, while the MEAT outlier in this embodiment can be used to detect 515 pieces of abnormal test data from 582 pieces of published data, and a corresponding detection rate=(515/582)*100%.=88.49%.

Therefore, the test data detection method in this embodiment can be used to effectively analyze abnormal test data, thus effectively improving the test quality of the chip.

In addition, the experiment proves that the MEAT detection method in this embodiment covers more than 95% of the unit tests of C++ version and Java version. Even the MEAT detection method may also be applied to data consistency check across operating systems and programming languages, so as to realize the creation and real-time storage of traceable adaptive data.

In this embodiment, filtering, grouping, and other processing are performed based on collected historical test data of several historical batches of products and a preset test parameter (such as a test item), and the target group is screened out based on the distribution pattern of the test data in each group to calculate the initial test limit value. When robustness of the test data of the new batch of products meets a set condition, the current test data is inserted into a previous training population to form a new training population, and then a new dynamic test limit value is obtained through updating. That is, in the MEAT detection method, the population evolution is monitored based on data robustness (fitness/robustness), so that the test limit value can be adjusted dynamically and adaptively, and chip test data with abnormal data can be effectively detected in real time, thereby improving test quality of the chip.

Embodiment 5

FIG. 13 is a schematic structural diagram of an electronic equipment according to Embodiment 5 of the present invention. The electronic equipment includes a memory, a processor, and a computer program stored in the memory and executable on the processor, where when the program is executed by the processor, the detection method of product test data according to any one of Embodiment 1 or Embodiment 2 is implemented. The electronic equipment 30 shown in FIG. 13 is only an example, and should not impose any limitation on the function and scope of use of the embodiments of the present invention.

As shown in FIG. 13, the electronic equipment 30 may be represented as a general-purpose computing equipment, such as a server equipment. A component of the electronic equipment 30 may include, but is not limited to, the at least one processor 31, the at least one memory 32, and a bus 33 connecting different system components (including the memory 32 and the processor 31).

The bus 33 includes a data bus, an address bus, and a control bus.

The memory 32 may include a volatile memory, such as a random access memory (RAM) 321 and/or a cache memory 322, and may further include a read-only memory (ROM) 323.

The memory 32 may further include a program/utility 325 with a set of (at least one) program modules 324, and such a program module 324 includes, but is not limited to, an operating system, one or more application programs, other program modules, and program data. Each or some combination of these examples may include the implementation of a network environment.

The processor 31 executes various functional applications and data processing by running the computer program stored in the memory 32, such as the detection method of product test data in any one of Embodiment 1 or Embodiment 2 of the present invention.

The electronic equipment 30 may also communicate with one or more external devices 34 (for example, a keyboard, a pointing equipment, and the like). This communication may be performed through an input/output (I/O) interface 35. Furthermore, the model-generated equipment 30 may also communicate with one or more networks (such as local area network (LAN), wide area network (WAN) and/or public networks, such as the Internet) through a network adapter 36. As shown in FIG. 13, the network adapter 36 communicates with other modules of the model-generated equipment 30 through the bus 33. It should be understood that, although not shown in the figure, other hardware and/or software modules may be used with the model-generated equipment 30, including but not limited to microcode, an equipment driver, a redundant processor, an external disk drive array, an RAID (disk array) system, a tape drive, a data backup storage system, and the like.

It should be noted that although several units/modules or sub-units/modules of electronic equipment are mentioned in the foregoing detailed description, this division is merely an example and not mandatory. Actually, according to the implementations of the present invention, features and functions of two or more units/modules described above may be embodied in one unit/module. On the contrary, the features and functions of one unit/module described above may be further divided into a plurality of units/modules for reification.

Embodiment 6

This embodiment provides a computer readable storage medium, having a computer program stored thereon, where when the program is executed by a processor, steps of the detection method of product test data according to any one of Embodiment 1 or Embodiment 2 are implemented.

More specifically, the readable storage medium may include, but is not limited to, a portable disk, a hard disk, a random access memory, a read-only memory, an erasable programmable read-only memory, an optical storage device, a magnetic storage device, or any suitable combination of the above.

In a possible implementation, the present invention may also be implemented in the form of a program product, which includes program code, and when the program product runs on a terminal equipment, the program code is used to enable the terminal equipment to perform steps of the detection method of product test data according to any one of Embodiment 1 or Embodiment 2.

The program code for executing the present invention can be written in any combination of one or more programming languages, and the program code can be completely executed on user equipment, partially executed on user equipment, executed as an independent software package, partially executed on user equipment and partially executed on a remote equipment, or completely executed on a remote equipment.

Although the specific embodiments of the present invention have been described above, those skilled in the art should understand that these are only examples, and the protection scope of the present invention is defined by the appended claims. Without departing from the principle and essence of the present invention, those skilled in the art can make various improvements and modifications to these embodiments, which shall all fall within the protection scope of the present invention.

What is claimed is:

1. A detection method of product test data, wherein the detection method comprises:
   obtaining historical test data corresponding to a plurality of historical batches of products;
   screening the historical test data to obtain intermediate test data;
   grouping the intermediate test data based on different preset test parameters to obtain a plurality of first groups, wherein each of the preset test parameters is corresponding to one of the first groups;
   obtaining a first distribution pattern corresponding to each of the first groups based on the intermediate test data corresponding to the first groups;
   determining whether the first distribution pattern is a preset distribution pattern, and if so, using the first group corresponding to the first distribution pattern as a target group; and
   obtaining a target test limit value based on the intermediate test data corresponding to the target group, wherein
   the target test limit value is used to test data of a new batch of products.

2. The detection method of product test data according to claim 1, wherein the step of obtaining a target test limit value based on the intermediate test data corresponding to the target group comprises:
   calculating a statistical parameter corresponding to the target group based on the intermediate test data corresponding to the target group, wherein the statistical parameter comprises a mean value and a mean square error; and
   calculating an upper test limit value and a lower test limit value based on the statistical parameter and a preset constraint condition, and using the upper test limit value and the lower test limit value as the target test limit value.

3. The detection method of product test data according to claim 1, wherein after the step of obtaining a target test limit value based on the intermediate test data corresponding to the target group, the method further comprises:

obtaining current test data corresponding to a current test group in a current batch of products;

obtaining, in the current test data, a plurality of groups of target test data corresponding to the different preset test parameters;

determining whether the target test data is within the corresponding target test limit value, and if so, determining the target test data as normal test data; if not, determining the target test data as abnormal test data; and when a set amount of the target test data are all normal test data, determining that the current test data of the current test group passes detection; otherwise, determining that the current test data of the current test group fails the detection.

4. The detection method of product test data according to claim 3, wherein when it is determined that the current test data corresponding to the current test group in the current batch of products passes the detection, and the preset distribution pattern is normal distribution, the detection method further comprises:

using the intermediate test data corresponding to the target group as a current training population;

calculating an initial population parameter corresponding to the current training population;

determining, based on the initial population parameter, whether the current test data falls into a central area of normal distribution corresponding to the current training population, if so, determining that robustness of the current test data meets a preset requirement, and inserting the current test data into the current training population to form a target training population;

updating the target test limit value based on test data corresponding to the target training population;

for test data corresponding to a next test group in the current batch of products, calculating a target population parameter corresponding to the target training population;

determining, based on the target population parameter, whether the current test data falls into a central area of normal distribution corresponding to the target training population, if so, determining that robustness of the current test data meets a preset requirement, and inserting the current test data into the target training population to form the new target training population; and updating the target test limit value based on test data corresponding to the new target training population.

5. The detection method of product test data according to claim 4, wherein the detection method further comprises:

determining whether test data in the target training population meets a preset condition, and if so, generating first test data to update the target training population, wherein a statistical parameter difference between the target training population before updating and the updated target training population is less than a first set threshold, and test data corresponding to the updated target training population does not meet the preset condition; the statistical parameter comprises a mean value and a mean square error.

6. The detection method of product test data according to claim 5, wherein the step of determining whether test data in the target training population meets a preset condition, and if so, generating first test data to update the target training population comprises:

obtaining a quartile corresponding to the test data in the target training population; and determining whether a first quartile in the quartile is equal to a third quartile, and if so, randomly generating the first test data to update the target training population.

7. The detection method of product test data according to claim 6, wherein the step of randomly generating the first test data to update the target training population comprises:

using at least one of an inverse function sampling method, a Box-Muller transform method, and a central limit theorem to randomly generate a group of second test data respectively, calculating a difference between a statistical parameter corresponding to each group of the second test data and a statistical parameter of the target training population before updating, and selecting the second test data corresponding to a minimum absolute value of the difference as the first test data to update the target training population.

8. The detection method of product test data according to claim 1, wherein the step of screening the historical test data to obtain intermediate test data comprises:

screening third test data corresponding to all the preset test parameters from the historical test data; and removing test data exceeding a preset test limit value from the third test data to obtain the intermediate test data.

9. The detection method of product test data according to claim 1, wherein the step of grouping the intermediate test data based on different preset test parameters to obtain a plurality of first groups comprises:

grouping the intermediate test data based on the different preset test parameters to obtain a plurality of intermediate groups; and determining whether a size of the intermediate group is greater than or equal to a second set threshold, and if so, using the intermediate group as the first group.

10. The detection method of product test data according to claim 8, wherein before the step of obtaining historical test data corresponding to a plurality of historical batches of products, the method further comprises:

establishing a static data space in advance;

after the step of obtaining historical test data corresponding to a plurality of historical batches of products, and before the step of screening the historical test data to obtain intermediate test data, the method comprises:

obtaining the historical test data in a set format, decoding the historical test data, and storing the decoded historical test data in the static data space; and the step of screening third test data corresponding to all the preset test parameters from the historical test data comprises:

outputting the third test data from the static data space through different application program interfaces based on all the preset test parameters.

11. An electronic equipment, comprising a memory, a processor, and a computer program stored in the memory and executable on the processor, wherein when the computer program is executed by the processor, the detection method of product test data according to claim 1 is implemented.

12. A non-transitory computer readable storage medium, having a computer program stored thereon, wherein when the computer program is executed by a processor, steps of the detection method of product test data according to claim 1 are implemented.

13. A detection system of product test data, wherein the detection system comprises:

a historical data obtaining module, configured to obtain historical test data corresponding to a plurality of historical batches of products;

an intermediate data obtaining module, configured to screen the historical test data to obtain intermediate test data;

a group obtaining module, configured to group the intermediate test data based on different preset test parameters to obtain a plurality of first groups, wherein each of the preset test parameters is corresponding to one of the first groups;

a distribution pattern obtaining module, configured to obtain a first distribution pattern corresponding to each of the first groups based on the intermediate test data corresponding to the first groups;

a first judging module, configured to: determine whether the first distribution pattern is a preset distribution pattern, and if so, use the first group corresponding to the first distribution pattern as a target group; and a test limit value obtaining module, configured to obtain a target test limit value based on the intermediate test data corresponding to the target group, wherein the target test limit value is used to test data of a new batch of products.

* * * * *